United States Patent [19]

Sutrina

[11] Patent Number: 5,440,172

[45] Date of Patent: Aug. 8, 1995

[54] INTEGRAL HEAT SINK INTERFACE

[75] Inventor: Thomas A. Sutrina, Rockford, Ill.

[73] Assignee: Sundstrand Corporation, Rockford, Ill.

[21] Appl. No.: 83,430

[22] Filed: Jun. 28, 1993

[51] Int. Cl.[6] .................. H01L 23/02; H02B 1/04; H02B 1/20

[52] U.S. Cl. ................... 257/712; 257/713; 257/717; 257/718; 257/719; 361/704; 361/705; 361/708; 361/746

[58] Field of Search ............ 257/666, 675, 706, 712, 257/713, 714, 717, 718, 719, 796; 361/704, 705, 708, 746

[56] References Cited

U.S. PATENT DOCUMENTS 4,893,174  1/1990  Yamada et al. ............... 257/714

OTHER PUBLICATIONS

Experimental/Numerical Heat transfer in Combustion and Phase Change, HTD-vol. 170, 1991, Antonetti et al, "An Approximal Thermal Contact Conduction Correlation", 35-42.
P. W. O'Callaghan et al, 1981, "Prediction of Optimal Interfacial Filler Thickness for Minimum Thermal Contact Resistance", 1-7.
Snaith et al, 1984, "Interstitial Materials for Controlling Thermal Conductances Across Pressed Metallic Contacts", 175-191.

Primary Examiner—Sara W. Crane
Assistant Examiner—Carl Whitehead, Jr.
Attorney, Agent, or Firm—Jeffery J. Makeever

[57] ABSTRACT

An apparatus comprises a thermal energy generating device and a thermal energy dissipating device having a reduced thermal resistance of the interface between the two. The reduction is achieved by interposing a xylylene polymer layer between the two contact surfaces and applying a surface pressure sufficient to deform the xylylene polymer layer into the surface irregularities of the two surfaces. A reduction in the thermal resistance comparable to that which may be achieved by the use of a silicone grease or an indium foil may be realized if the layer is kept below eight times the air gap mean thickness caused by the surface irregularities. Layer thicknesses beyond this will serve to insulate or increase the thermal resistance between the two surfaces.

2 Claims, 1 Drawing Sheet

INTEGRAL HEAT SINK INTERFACE

FIELD OF THE INVENTION

The present invention relates generally to the transfer of thermal energy from a thermal energy generating device to a thermal energy dissipating device, and more specifically to the thermal transfer across the surface interface between a power semiconductor and a heat sink.

BACKGROUND ART

Power semiconductors have long been used in large commercial applications such as ground based power supplies, elevators, electric locomotives, etc. In these applications power semiconductor package size and weight, as well as the type and amount of cooling required was not of great concern. With the increased use of these devices in aerospace applications, however, package size and the associated cooling requirements become very important.

On an aircraft every pound of additional weight results directly in increased fuel burn, and in turn higher operating costs for the airlines. Also, every additional cubic foot used by required operating equipment detracts from the amount of revenue generating cargo which the airplane can carry. With the increased use of power semiconductors on aircraft, and in particular as key elements of total aircraft power systems, the effort to minimize package size and reduce weight is paramount. Countering this effort, however, is the requirement for more and more power usage on the modern aircraft. The substantial financial penalties levied on the suppliers of these power systems for equipment which is overweight and oversize will guarantee that the effort for small package size and reduced weight will continue.

One problem associated with increased power requirements in a reduced package size is that an increased amount of heat, as generated by the non-perfect nature of the devices, must be removed from a smaller area. The concept of thermal resistance, see equation 1, is a measure of the difficulty of heat transfer from one place to another.

$$\text{Thermal Resistance} = R_{TH} = L/k(A) \qquad (1)$$

where L32 material thickness
k = thermal conductivity
A = surface area

From this equation one can see that if all else remains constant, a decrease in surface area results in an increased thermal resistance, that is, it becomes more difficult to remove the increased amount of heat generated in the smaller package. This is a problem for power semiconductors as many exhibit a phenomenon known as thermal runaway. As the temperature of the device rises, the resistance to electrical current flow drops which results in increased current flow and increased heat generation. Increased heat generation results in decreased resistance to electrical current flow which results in increased heat generation, and so forth. This situation continues until the device self destructs.

One way to remove the heat generated by these power semiconductors is to increase the cooling flow by use of fans or air conditioners, or even by use of fluid cooling systems. The problem with these systems for many applications is increased cost and weight. A more practical solution is to attach a heat sink to the power semiconductor package and allow the heat generated to be transferred to the fins of the heat sink. In this way, the area from which heat may be removed is increased. Referring back to the concept of thermal resistance, see equation 1, an increase in area will result in a decrease in thermal resistance, that is, it becomes easier to remove the heat.

With the increasing amounts of power that the aerospace power semiconductors are required to handle, a small loss in efficiency can have disasters effects. This statement holds true for the efficiency of heat removal as well. Because the power semiconductor package surface and the heat sink surface are not polished, perfectly smooth surfaces, and because they are bolted together to lower the construction and maintenance costs, the area of actual contact between these two is small. In a dry electronic compartment, these gaps are filled with air and, although these air gaps are small, the resulting thermal resistance is quite large, i.e. it is difficult to transfer heat through these air gaps.

The difficulty or ease of heat transfer through a material is inherent within the material itself, and is denoted as a number known as the material's thermal conductivity. Copper, for example, is a very good thermal conductor and has a thermal conductivity of 384. Air, on the other hand, is a very poor thermal conductor with a thermal conductivity of 0.015 to 0.03, over 12,000 times smaller than that of copper.

Since a perfectly smooth surface is difficult to obtain and a perfect contact between the power semiconductor and the heat sink is even more difficult to obtain, it is known within the art to fill the small air gaps resulting from the surface irregularities with a better thermal conductor than air. Although some of the air gaps can be closed with increased surface pressure, material limitations will not allow this method to be greatly effective. Within the art, the use of a silicone grease or an indium foil has become the preferred method of filling the air gaps of the surface interface between the power semiconductor and the heat sink. These materials have been chosen because of special properties unique to them.

Although silicone grease has a thermal conductivity of only approximately 10 times that of air, it is often used as an interface media because it tends to fill only the air gaps and is displaced by, that is, it does not interfere with, the power semiconductor/heat sink surface contact points. This results in a much more efficient transfer of heat to the fins of the heat sink. As with any fluid material, however, the problem of migration is apparent with the use of a silicone grease. This results in a loss of material where it is supposed to be and an increase of material where it is not supposed to be. This loss of the silicone grease from the surface air gaps, in addition to containing other surfaces, results in a loss of heat transfer efficiency as air is once again the transfer media.

One prior art method used to increase the heat transfer efficiency while avoiding the problems associated with a silicone grease is to use an indium foil as a heat transfer interface media. Although indium's thermal conductivity is 2,000 to 4,000 times better than air and approximately 300 times better than that of silicone grease, its effectiveness is limited by its minimum handling thickness, which is on the order of 0.002 inch, and as can be seen from equation 1, the larger the thickness, the greater the thermal resistance. The net result of the thicker foil on overall power semiconductor to ambient thermal resistance is about the same as if a silicone grease were used as the thermal transfer interface media. Indium foil fills the surface irregularities by cold flowing and cold welding itself to the entire surface of both the power semiconductor and the heat sink, thus eliminating any air gaps which otherwise would have formed. The problem with indium, besides the high cost of the material itself, is that it increases the cost of repair. Increased repair costs are associated with the cold welding nature of indium. When the power semiconductor is separated from the heat sink, the indium foil, which has cold welded itself to both surfaces, tears, forming 0.002 inch thick mesas on the power semiconductor and 0.002 inch thick mesas on the heat sink. Because the thickness needs to be limited to keep the thermal resistance to a minimum, the foil must be scraped from both surfaces before new foil can be applied and the two re-attached.

The present invention is directed to overcoming one or more of the above problems by using a material never before considered appropriate in the art for the intended application.

The xylylene polymer known as parylene is used within the art as a conformal coating of circuit boards, hybrid circuits, and semiconductors, in addition to use as an electrical insulator for small electrical components such as miniature stepping motors used in wristwatches. Parylene is utilized in these applications because of its dielectric strength, that is, its ability to resist the transmission of electrical energy, its excellent chemical resistance and its resistance to fungal attack. Parylene, though, is not a good thermal conductor, as its thermal conductivity ranging from 0.082 to 0.12, only three (3) to eight (8) times better than air itself.

SUMMARY OF THE INVENTION

It is the principle objective of the instant invention to provide an apparatus with an improved thermal transfer interface between the thermal energy generating device and the thermal energy dissipating device. More specifically, the improved thermal transfer interface media is used to transfer thermal energy from a power semiconductor to a heat sink by filling the associated air gaps resulting from the surface irregularities of both devices while reducing the cost associated with the application and maintenance of the material and increasing the efficiency of heat transfer overall.

In accordance with the present invention, a thin polymer layer is interposed between the contact surfaces of the thermal energy generating device and the thermal energy dissipating device. A sufficient pressure in a normal manner known in the art is used to secure the two devices together, deforming the thin polymer layer into the surface irregularities of both devices thereby.

The specific polymer is a xylylene polymer selected from the group known in the art as Parylene N (DPXN), Parylene C (DPXC), and Parylene D (DPXD). The coating thickness of the parylene layer is controlled to between 0.1 micron to eight times the mean thickness of the air gaps resulting from the surface irregularities of the thermal energy generating device and the thermal energy dissipating device. The pressure which is applied to the two surfaces after attachment is sufficient to allow the parylene coating to deform into the surface irregularities.

In an alternate embodiment of the present invention, the uniform parylene layer is deposited to a thickness greater than eight times that of the air gap thickness. In this way the thermal resistance is increased between the two surfaces involved. Such an application may be desirable to direct heat away from sensitive components and allow the heat sink connected on an alternate surface to channel away the thermal energy.

Other objectives and advantages will become apparent from the following specification taken in conjunction with the accompanying drawings.

DESCRIPTION OF THE PREFERRED EMBODIMENTS

Figure 1:
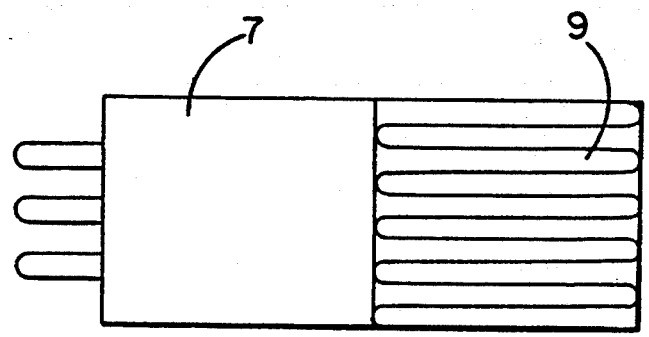
FIG. 1 is a cross sectional view of energy generating device/thermal energy dissipating device assembly constructed in accordance with the present invention.
Figure 2:
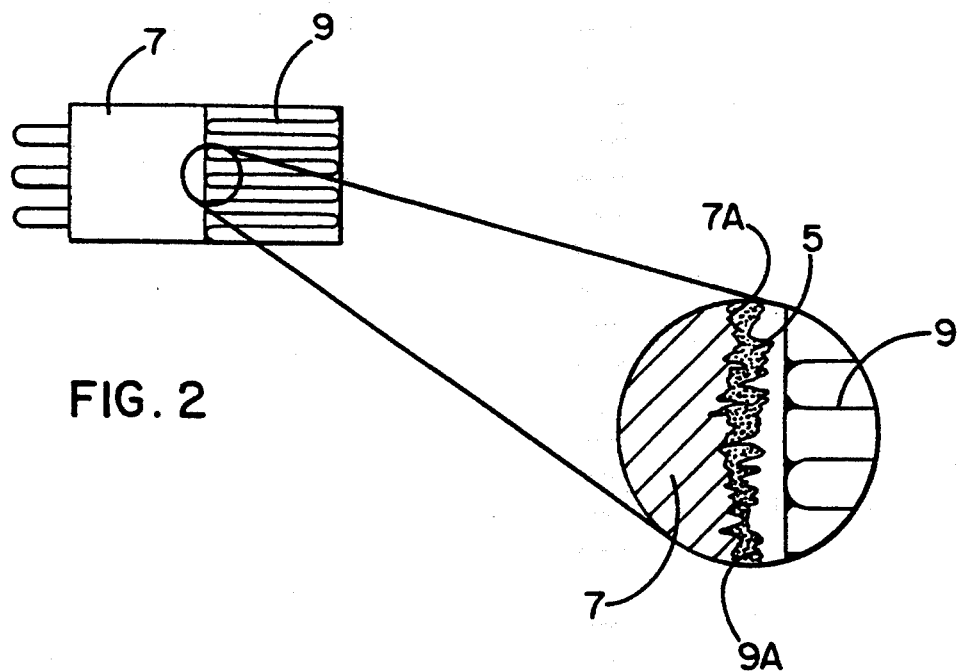
FIG. 2 is a magnified view of the interface of a thermal energy generating device/thermal energy dissipating device assembly constructed in invention.

An exemplary embodiment of an apparatus with an improved thermal transfer interface between the thermal energy generating device and the thermal energy dissipating device made in accordance with the instant invention is illustrated in the drawings and will be described herein. However, it is to be understood that the thermal interface may be used with efficacy in any type of system wherein one element is to be positioned next to another and the transfer of thermal energy between the two is to be aided or impeded.

As shown in FIG. 1, the apparatus of the present invention comprises a thermal energy generating device 7, a thermal interface transfer media 5, and a thermal energy dissipating device 9. As contemplated in the preferred embodiment of the present invention, the thermal energy generating device 7 is a power semiconductor, such as an insulated gate bipolar transistor (IGBT), and the thermal energy dissipating device 9 is a heat sink. The thermal interface transfer media 5 as contemplated in the present invention is formed as a uniform layer of a polymer, preferrably a xylylene polymer, whose thickness is controlled to either preferably a very thin layer, or alternatively a thicker layer.

In accordance with the present invention, a xylylene polymer 5 is interposed between the contact surfaces 7a, 9a of the power semiconductor 7 and the heat sink 9 respectively. A sufficient pressure applied in a normal manner known in the art is used to compressively attach the two devices 7, 9 together, deforming the layer of the xylylene polymer 5 into the air gaps formed by the surface irregularities of both devices thereby.

In a preferred embodiment of the present invention, the xylylene polymer 5 is applied to a clean surface 7a, 9a which has been treated with an adhesion promoter which is known in the art to be suitable to the material of at least one of the compressively attached contact surfaces 7a, 9a which is to be coated. The application process used to form the layer of a xylylene polymer 5 on at least one of the compressively attached contact surfaces 7a, 9a would preferably be a vapor deposition polymerization (VDP) process because of the exacting thickness control and the uniformity of the resulting layer of the xylylene polymer 5. The specific VDP process used is selected from those known in the art for xylylene polymer coating such as the pyrolyric cleavage of a di-p-xylylene (DPX) dimer. The specific di-pxylylene (DPX) dimer used is selected from the group known in the art as Parylene N (DPXN), Parylene C (DPXC), and Parylene D (DPXD) and commercially sold under these names/or by companies such as Nova Tran Corporation of Clear Lake Wisc.

The coating thickness of the parylene layer 5 is controlled to between 0.1 micron to eight times the mean thickness of the air gaps resulting from the surface irregularities of the contact surfaces 7a, 9a of the power semiconductor 7 and the heat sink 9. The compressive force which is applied to the two contact surfaces 7a, 9a after attachment is sufficient to allow the parylene layer 5 to deform into the air gaps formed by the surface irregularities of the power semiconductor 7 and the heat sink 9. A force of 250 pounds per square inch has been found to be sufficient.

Figure 3:
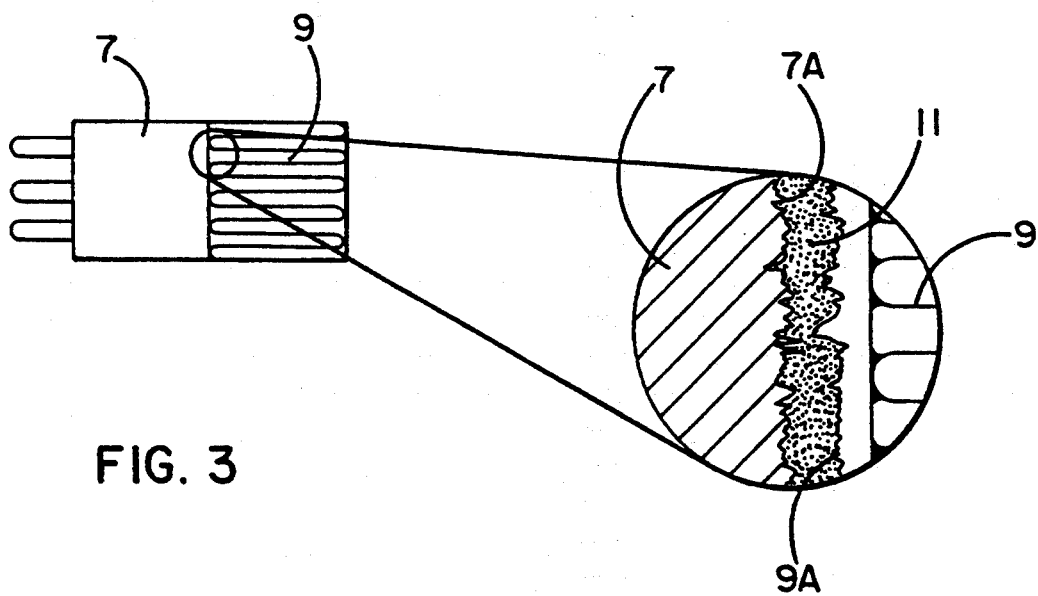
FIG. 3 is a magnified view of the interface of a thermal energy generating device/thermal energy dissipating device assembly constructed in accordance with an alternative embodiment of the present invention.

In an alternate embodiment of the present invention illustrated in FIG. 3, the parylene layer 11 thickness is allowed to be deposited to a thickness greater than eight times that of the air gap mean thickness formed by the surface irregularities of the contact surfaces 7a, 9a of the power semiconductor 7 and the heat sink 9. In this way the thermal resistance between the two contact surfaces 7a, 9a is increased. Such an application may be desirable to direct heat away from sensitive components and allow the heat sink 9 connected on an alternate surface to channel away the thermal energy.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. The details of the structure may be varied substantially without departing from the spirit of the invention, and the exclusive use of all modifications which come within the scope of the appended claims is reserved.

What is claimed is:

1. An apparatus from which thermal energy is to be removed, comprising:

a thermal energy generating device having a first surface from which thermal energy is to be removed, Said first surface having surface irregularities; a thermal energy dissipating device having a second surface to which thermal energy is to be transferred, said second surface having surface irregularities, said second surface compressively attached to said first surface of said thermal energy generating device defining an interface having air gaps of a measurable thickness therebetween; and a xylylene polymer layer interposed between said first surface of said thermal energy generating device and said second surface of said thermal energy dissipating device filling said air gaps therebetween, Said xylylene polymer layer deposited on at least one of said compressively attached surfaces of said thermal energy generating device and said thermal energy dissipating device to a thickness between 0.1 micron and eight times said measurable thickness of said air gaps, said xylylene polymer layer decreasing the thermal resistance of Said interface between said first surface of said thermal energy generating device and said second surface of said thermal energy dissipating device, 2. An apparatus, comprising:

a thermal energy generating device having a first surface having surface irregularities;

a thermal energy dissipating device having a second surface from which thermal energy is to be insulated, said second surface having surface irregularities, said second surface compressively attached to said first surface of said thermal energy generating device defining an interface having air gaps of a measurable thickness therebetween; and a xylylene polymer layer interposed between said first surface of said thermal energy generating device and said second surface of said thermal energy dissipating device filling said air gaps therebetween, said xylylene polymer layer deposited on at least one of said compressively attached surfaces of said thermal energy generating device and said thermal energy dissipating device to a thickness greater than eight times said measurable thickness of said air gaps, said xylylene polymer layer increasing the thermal resistance of said interface between said first surface of said thermal energy generating device and said second surface of said thermal energy dissipating device.

* * * * *